US005619033A

United States Patent [19]
Weisfield

[11] Patent Number: 5,619,033
[45] Date of Patent: Apr. 8, 1997

[54] LAYERED SOLID STATE PHOTODIODE SENSOR ARRAY

[75] Inventor: Richard L. Weisfield, Los Altos, Calif.

[73] Assignee: Xerox Corporation, Stamford, Conn.

[21] Appl. No.: 483,406

[22] Filed: Jun. 7, 1995

[51] Int. Cl.$^6$ .................................................. H01J 40/14
[52] U.S. Cl. ........................................ 250/208.1; 257/444
[58] Field of Search ............................. 250/208.1, 214.1;
257/458, 444, 446, 448, 53, 292

[56] References Cited

U.S. PATENT DOCUMENTS

| | | |
|---|---|---|
| 4,670,765 | 6/1987 | Nakamura et al. ................. 257/444 |
| 4,672,454 | 6/1987 | Cannella et al. . |
| 4,675,739 | 6/1987 | Catchpole et al. . |
| 4,785,186 | 11/1988 | Street et al. ................... 250/370.14 |
| 5,017,989 | 5/1991 | Street et al. ...................... 257/458 |
| 5,079,426 | 1/1992 | Antonuk et al. ................. 250/370.09 |
| 5,117,114 | 5/1992 | Street et al. ................... 250/370.11 |
| 5,164,809 | 11/1992 | Street et al. ...................... 257/55 |
| 5,235,195 | 8/1993 | Tran et al. ....................... 257/448 |
| 5,319,206 | 6/1994 | Lee et al. ........................ 250/370.09 |
| 5,381,014 | 1/1995 | Jeromin et al. ................. 250/370.09 |
| 5,396,072 | 3/1995 | Schiebel et al. ................. 250/370.09 |
| 5,420,452 | 5/1995 | Tran et al. ....................... 257/444 |
| 5,516,712 | 5/1996 | Wei et al. ......................... 437/40 |

FOREIGN PATENT DOCUMENTS 163956  12/1985  European Pat. Off. .

OTHER PUBLICATIONS

Physics of Medical Imaging—Medical Imaging, Jan. 1995—Proceedings—SPIE—The International Society for Optical Engineering, vol. 2432, pp. 237–249.

Primary Examiner—Que Le
Attorney, Agent, or Firm—Oliff & Berridge

[57] ABSTRACT

A photodetecting device and a method for constructing the photodetecting device. The photodetecting device provides at least one transistor formed over a substrate and at least one photodiode formed over the at least one transistor. Each of the at least one photodiode is coupled to one of the at least one transistor. The fill factor of the photodiode is very high even when the resolution of the photodetecting device is increased. The photodetecting devices are formed in a matrix having rows and columns. The matrix of photodetecting devices forms a two dimensional imaging device.

21 Claims, 16 Drawing Sheets

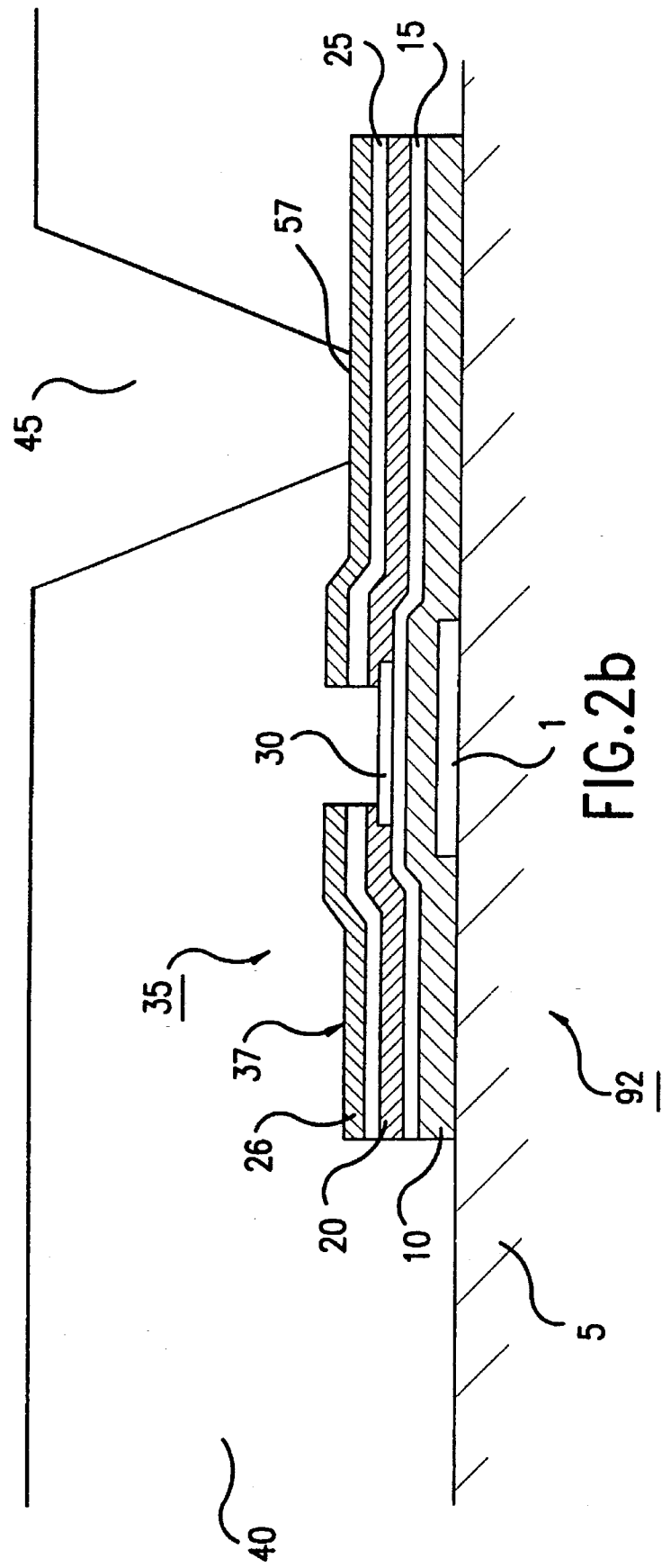

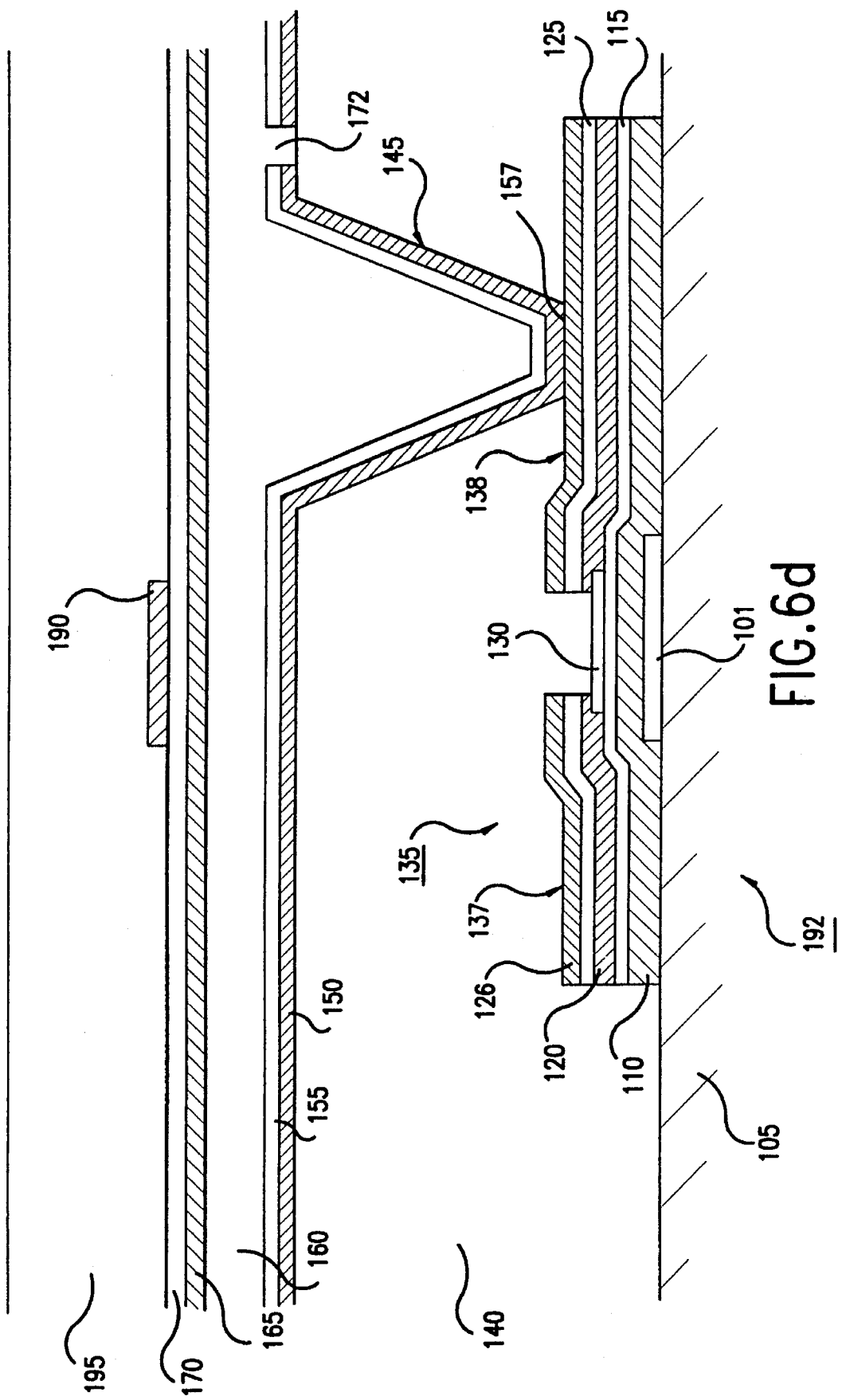

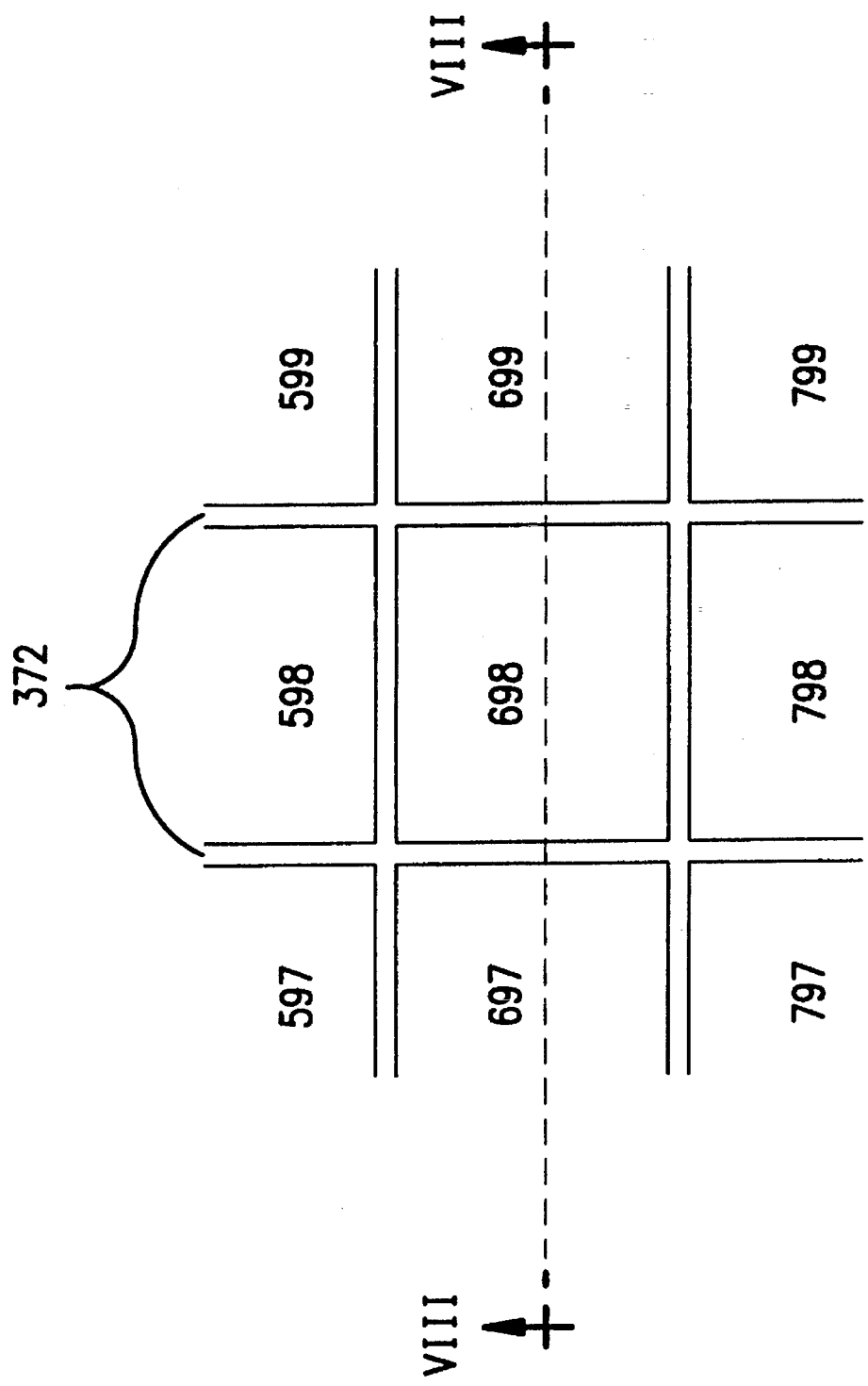

LAYERED SOLID STATE PHOTODIODE SENSOR ARRAY

BACKGROUND OF THE INVENTION

1. Field of the Invention

The invention generally relates to photodetection, and more particularly, to photodiode imaging devices.

2. Description of Related Art

Imaging devices such as scanners, photocopiers, or radiation imagers can use a sensor sheet comprising a two-dimensional layer of photodiodes which senses a light image directed onto it. Each photodiode is connected to a transistor. When light strikes a particular photodiode, an electrical charge is generated by the photodiode. The transistor switches the charge generated by the photodiode to other components such as an amplifier which amplifies the signal.

Conventionally, an active matrix array is a grid of pixels on a substrate with an active switching device, such as a thin film transistor. An active matrix imaging array is a grid of pixels on a substrate, where each pixel has a photodiode and a transistor formed on the same substrate surface. The transistor is typically located adjacent to the photodiode. The resolution of the active matrix array is determined by the number of pixels per unit area of the substrate surface. When the resolution of the active matrix array is increased, the size of each pixel decreases leaving less area for the photodiode, the transistor and the lines connecting the photodiode and the transistor.

When the transistor and connecting lines are not proportionally reduced in size, the size of the photodiode must be reduced by a greater proportion so that the transistor, the connecting lines and the photodiode will all fit on the pixel. This reduces the percentage of the surface area of the pixel covered by the photodiode. This percentage is the fill factor of the photodiode imaging device.

As the fill factor decreases, the amount of light received by the photodiode of each pixel also decreases thus reducing the quality of the photodiode imaging device. Further, as the fill factor decreases, the pixel undersamples the image, which accentuates the Modulation Transfer Function (MTF) at high spatial frequencies. This can increase the appearance of image artifacts like aliasing at high spatial frequencies and effectively degrades image resolution.

Moreover, when the widths of the connecting lines are reduced as the surface area of the pixel decreases, the operating speed of the photodiode imaging device is also reduced. This occurs because a reduction in the width of the connecting lines limits the current carrying capacity of the connecting lines and thus reduces the speed at which the electric charge in the photodiode can be transferred through the transistor to other components of the photodiode imaging device.

SUMMARY OF INVENTION

The invention provides a photodetection device comprising a transistor formed over a substrate and a photodiode formed over the transistor. The photodetection device is also provided in a matrix configuration forming a two dimensional image sensing array. Locating the photodiode over the transistor allows the connecting lines and the transistor to be sufficiently large to handle high operating speeds without crowding out the photodiode, and results in a photodetection device with good MTF and high speed operation capability. In addition, as the resolution increases and the pixel area decreases, the photodiode area may continue to approximate the pixel area and the fill factor remains very high.

BRIEF DESCRIPTION OF THE DRAWINGS

The invention will be described in detail with reference to the following drawings, wherein:

FIGS. 2a–2f show a method for making the photodetection device of the first preferred embodiment;

FIGS. 6a–6d show a method for making the photodetection device of the second preferred embodiment;

FIG. 7 is a top plan view of a contiguous array of the second preferred embodiment photodetection devices.

DETAILED DESCRIPTION OF THE PREFERRED EMBODIMENTS

Figure 1:
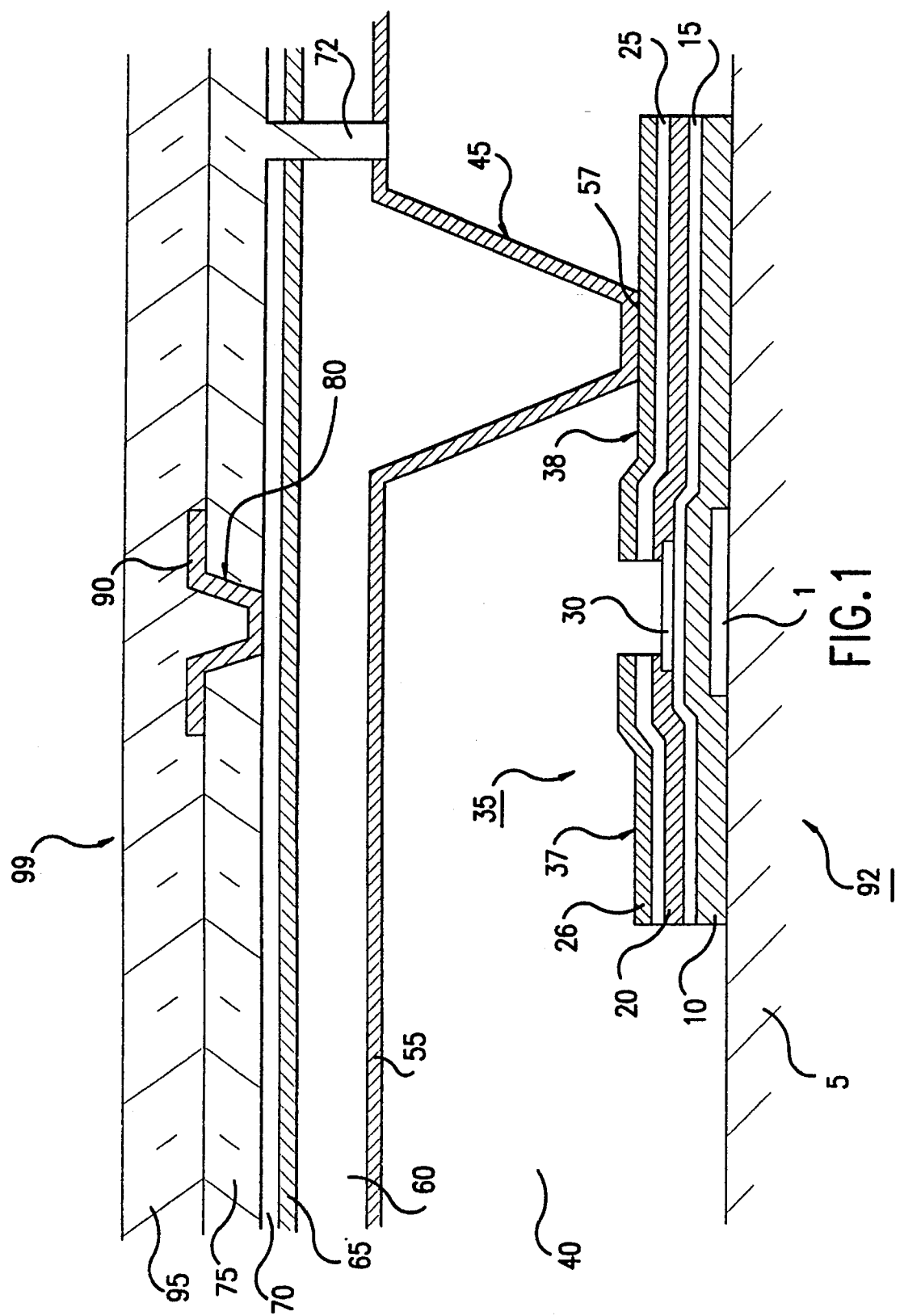
FIG. 1 is a cross-sectional view of a first preferred embodiment of the photodetection device.

FIG. 1 shows that a first preferred embodiment of a photodetection device 92 includes a thin-film field effect transistor (TFT) 35. The TFT 35 comprises a metal gate electrode 1 formed on a substrate 5. The metal comprises refractory metals such as a titanium-tungsten (TiW) layer about 1200Å thick covering an Al layer about 800Å thick. Other refractory metals like Cr, Mo, or Ta, are suitable alternatives. A gate dielectric layer 10 of silicon nitride (SiNx) about 3000Å thick is formed over the gate electrode and the substrate 5. A layer of hydrogenated amorphous silicon (a-Si:H) 15 which is about 300Å to about 500Å thick is formed over the gate dielectric layer 10.

An etch stopper 30 is formed from a layer of SiNx about 1500Å thick over the a-Si:H layer 15 above the gate electrode 1. An n+ layer 20 which is about 500Å to about 1000Å thick is formed over the a-Si:H layer 15 and partially over the etch stopper layer 30. A TiW metal layer 25 which is about 500Å thick is formed over the n+ layer 20 and an Al layer 26 which is about 0.5 microns to about 1.0 microns thick is formed over the TiW layer 25. The TiW metal layer 25 serves as a barrier layer preventing the Al layer 26 from interacting with the n+ layer 20. Other suitable refractory metals besides TiW may also be used.

The n+ layer 20, the TiW metal layer 25 and the Al layer 26 on the left side of the etch stopper 30 form the source electrode 37 of the TFT 35, and the n+ layer 20, the TiW metal layer 25 and the Al layer 26 on the right side of the etch stopper 30 form the drain electrode 38 of the TFT 35.

A silicon oxynitride (SION) layer 40 which is about 0.5 microns to about 2.0 microns thick is formed over the TFT 35 having a via hole 45. An n+ doped layer 55 which is about 500Å to about 1000Å thick is formed over the SiON layer 40 making contact with the drain electrode 38. An undoped a-Si:H layer 60 which is about 0.5 microns to about 2.0 microns thick is formed over the n+ doped layer 55. A p+ doped layer 65 which is about 100Å thick is formed over the undoped a-Si:H layer 60, and a conductive layer 70 that is also transparent is formed over the p+ doped layer 65. For this embodiment the conductive layer 70 is an indium-tin-oxide (ITO) layer which is about 500Å to about 1000Å thick. An SiON layer 75 which is about 0.5 microns to about 2.0 microns thick is formed over the conductive layer 70 having a via hole 80. A bias contact 90 is formed over the SiON layer 75 and contacts the conductive layer 70. For this embodiment, the bias contact is a layer of TiW about 500Å thick beneath a layer of Al about 0.5 microns to about 1.0 microns thick. Finally, a passivation layer 95 which is about 0.5 microns to about 1.0 microns thick is formed over both the conductive layer 70 and the bias contact 90. The passivation layer 95 comprises but is not limited to an SiON layer.

A notch 72 passes through the n+ doped layer 55, the a-Si:H layer 60, the p+ doped layer 65, and the conductive layer 70. This notch 72 is about 3 microns to about 10 microns wide, and separates the photodiode 99 from adjacent photodiodes.

During operation, the TFT 35 is turned OFF to allow the photodiode 99 to accumulate charge based on incident light. This accumulated charge is a received image signal. When a control signal is received from an external controller (not shown), the TFT 35 turns ON and transfers the accumulated charge of the photodiode 99 to the other components (not shown) that amplify and process the received image signal.

The photodiode 99 is biased by applying a voltage on the bias contact 90. The bias voltage induces an electric field in the a-Si:H layer 60. When light enters the a-Si:H layer 60, electron-hole pairs are generated. The electrons and holes are swept by the electric field to opposite sides of the photodiode 99 and accumulate near the photodiode electrode contacts, which are the conductive layer 70 and the n+ doped layer 55. When the TFT 35 is turned ON, the accumulated charges are allowed to flow as current through source electrode 37 to the other components.

Light interferes with the normal function of the TFT 35 by generating photoconductive effects within the TFT 35. Placing the bias contact 90 over the TFT 35 reduces the amount of light incident on the TFT 35.

Figure 2A:
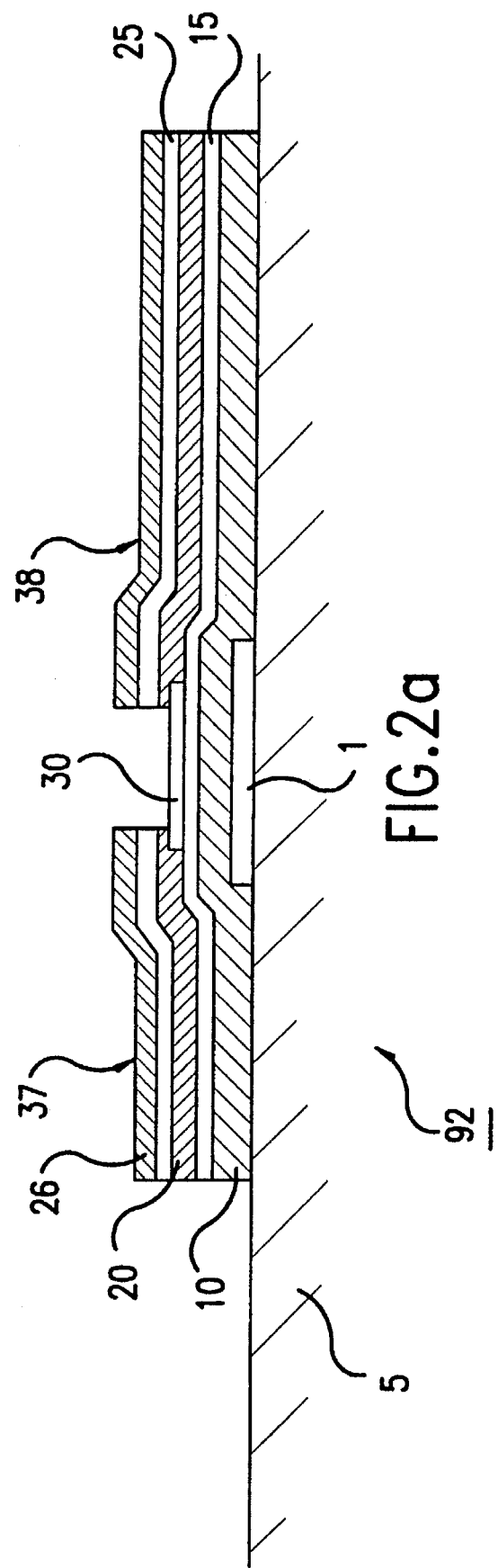
Figure 2C:
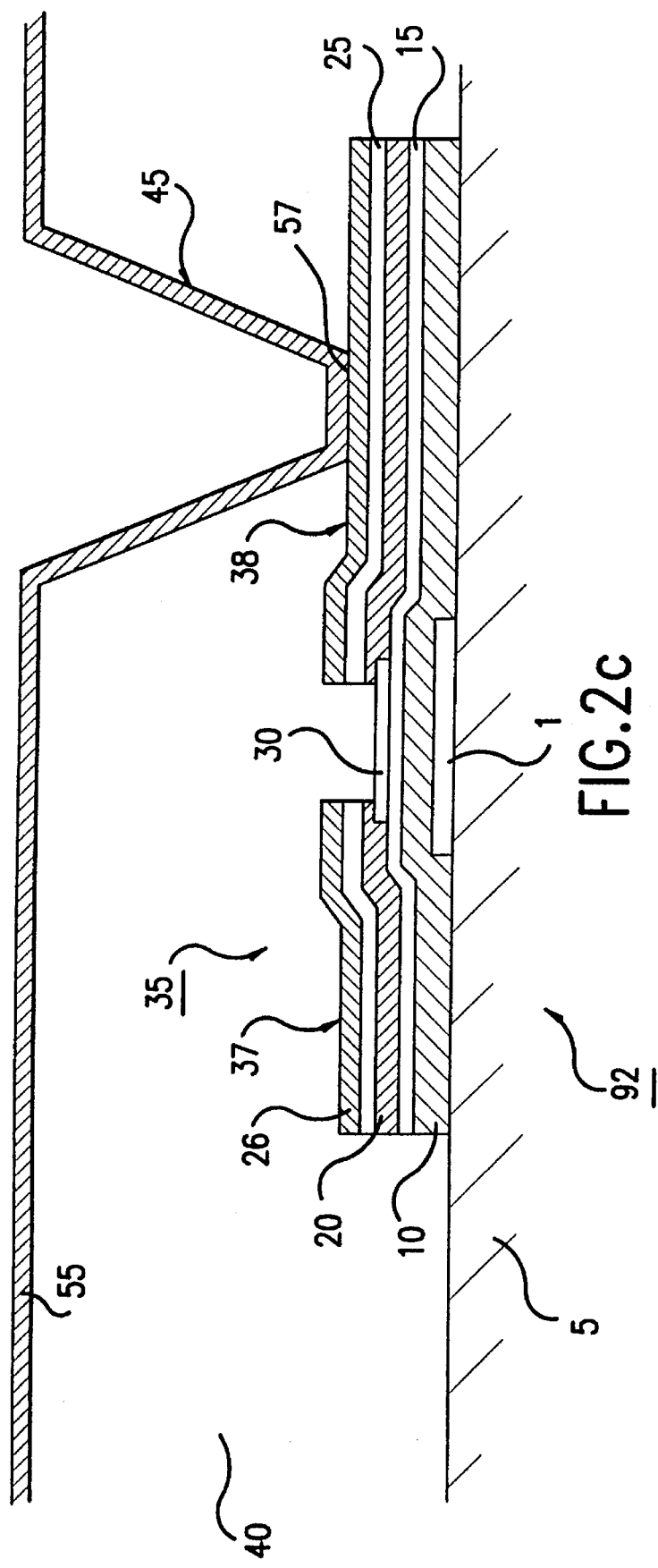

FIGS. 2a–2f show a preferred process to form the photodetection device 92. FIG. 2a shows that the TFT 35 is first formed over the substrate 5. In FIG. 2b, the SiON layer 40 is formed over the TFT 35. The SiON layer 40 is masked and etched to form the via hole 45 exposing the drain electrode 38. In FIG. 2c, the n+ doped layer 55 is formed over the SiON layer 40 making contact with the drain electrode 38. The n+ doped layer 55 which contacts the drain electrode 38 is a back contact 57. Since the photodiode 99 is above the TFT 35, the back contact 57 connects the photodiode 98 to the TFT 35. The back contact 57 is about 10 microns wide.

Figure 2D:
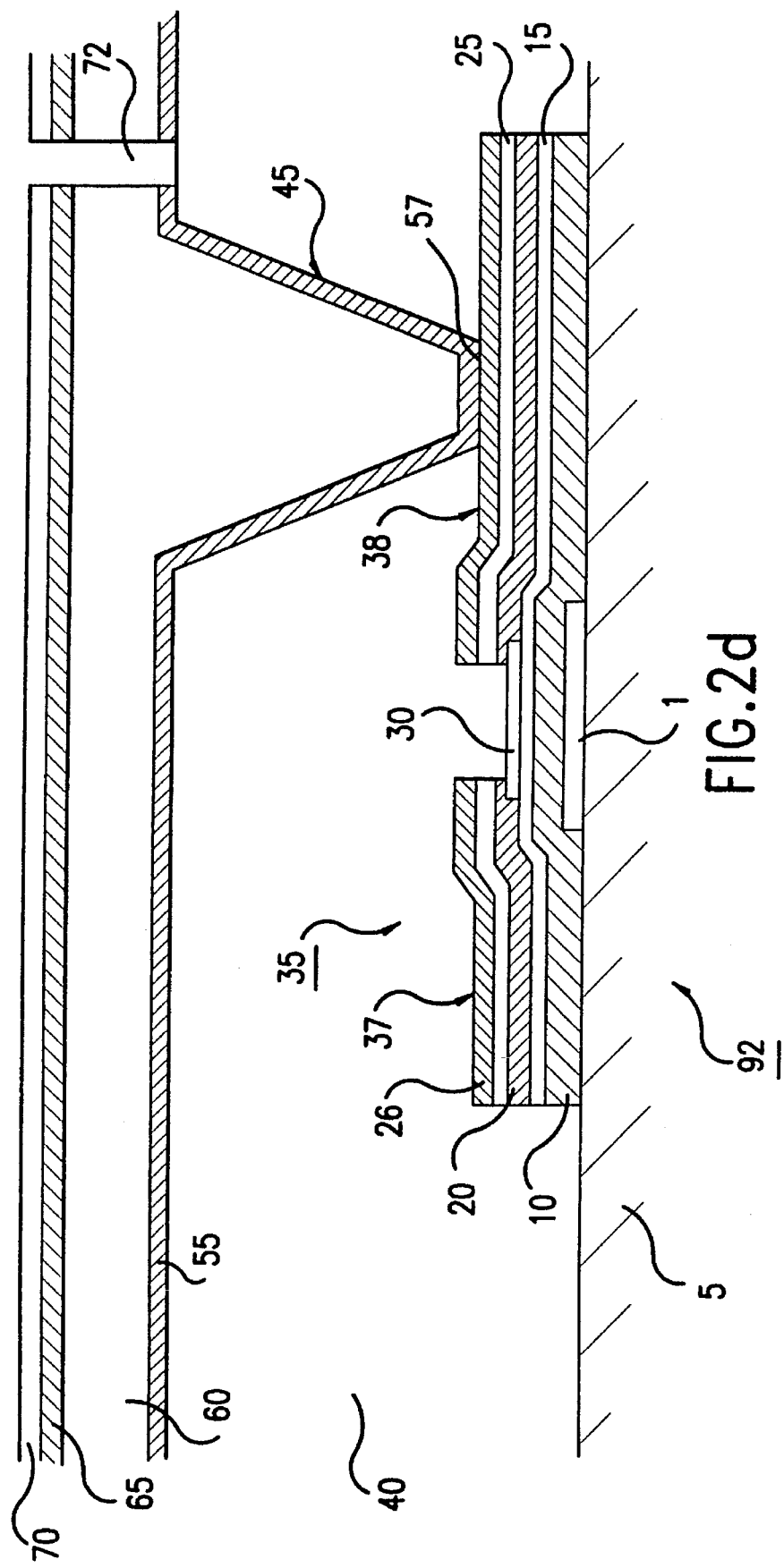

In FIG. 2d, the a-Si:H layer 60 is formed over the n+ doped layer 55. The p+ doped layer 65 is formed over the a-Si:H layer 60 and the conductive layer 70 is formed over the p+ doped layer 65. The conductive layer 70 is masked and etched to form the notch 72. The etching process etches the conductive layer 70, the p+ doped layer 65, the a-Si:H layer 60, and the n+ doped layer 55 exposing the SiON layer 75.

Figure 2E:
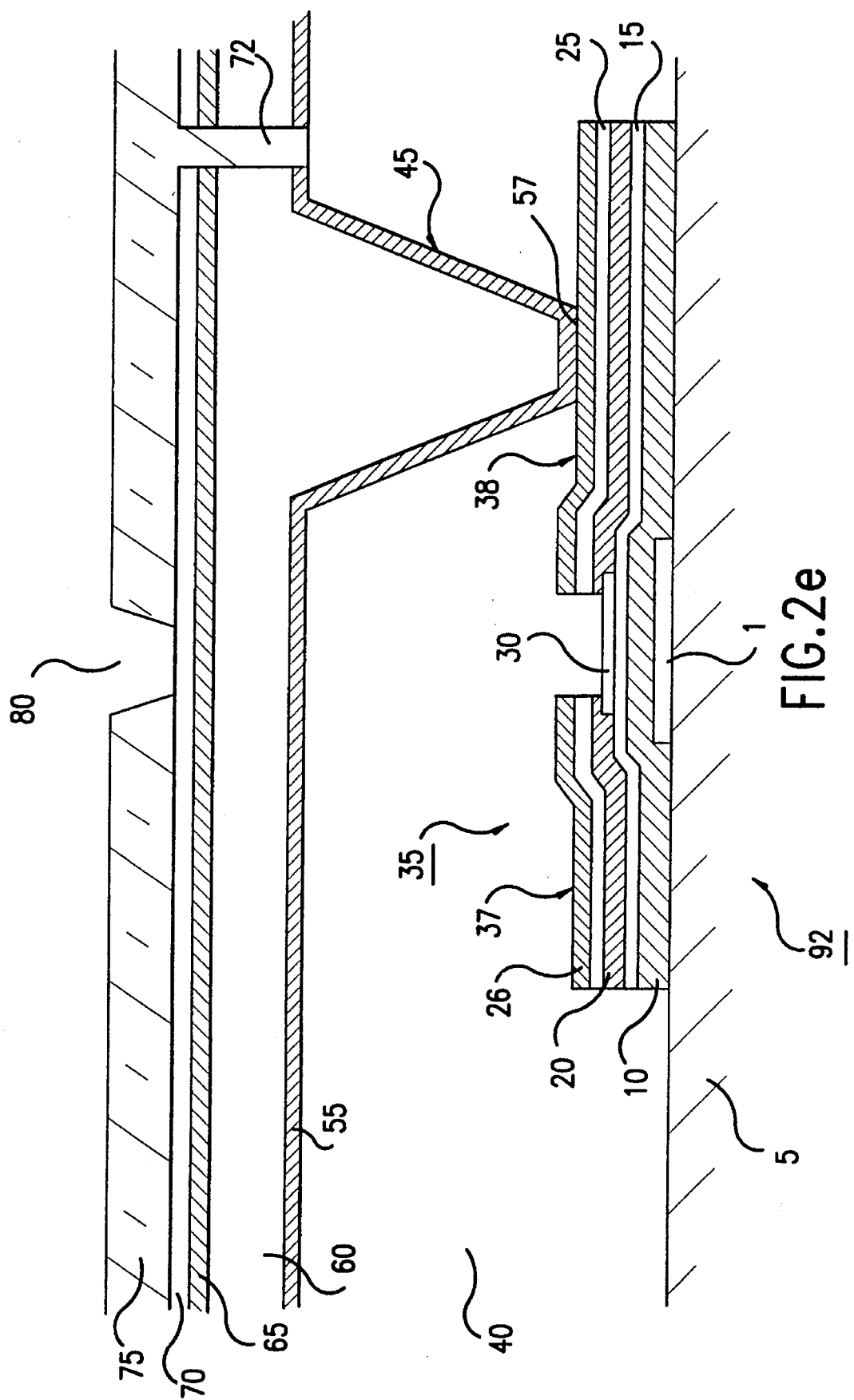

In FIG. 2e, the SiON layer 75 is formed over the conductive layer 70 and fills the notch 72. Thus, the SiON layer 75 prevents the metal bias layer 85 from filling the notch 72 and thereby prevents the metal bias layer from either shorting out the photodiode 99 by forming a connection across the etched layers, or providing a connection across the etch through the n+ layer which would defeat the purpose of the notch 72.

Figure 2F:
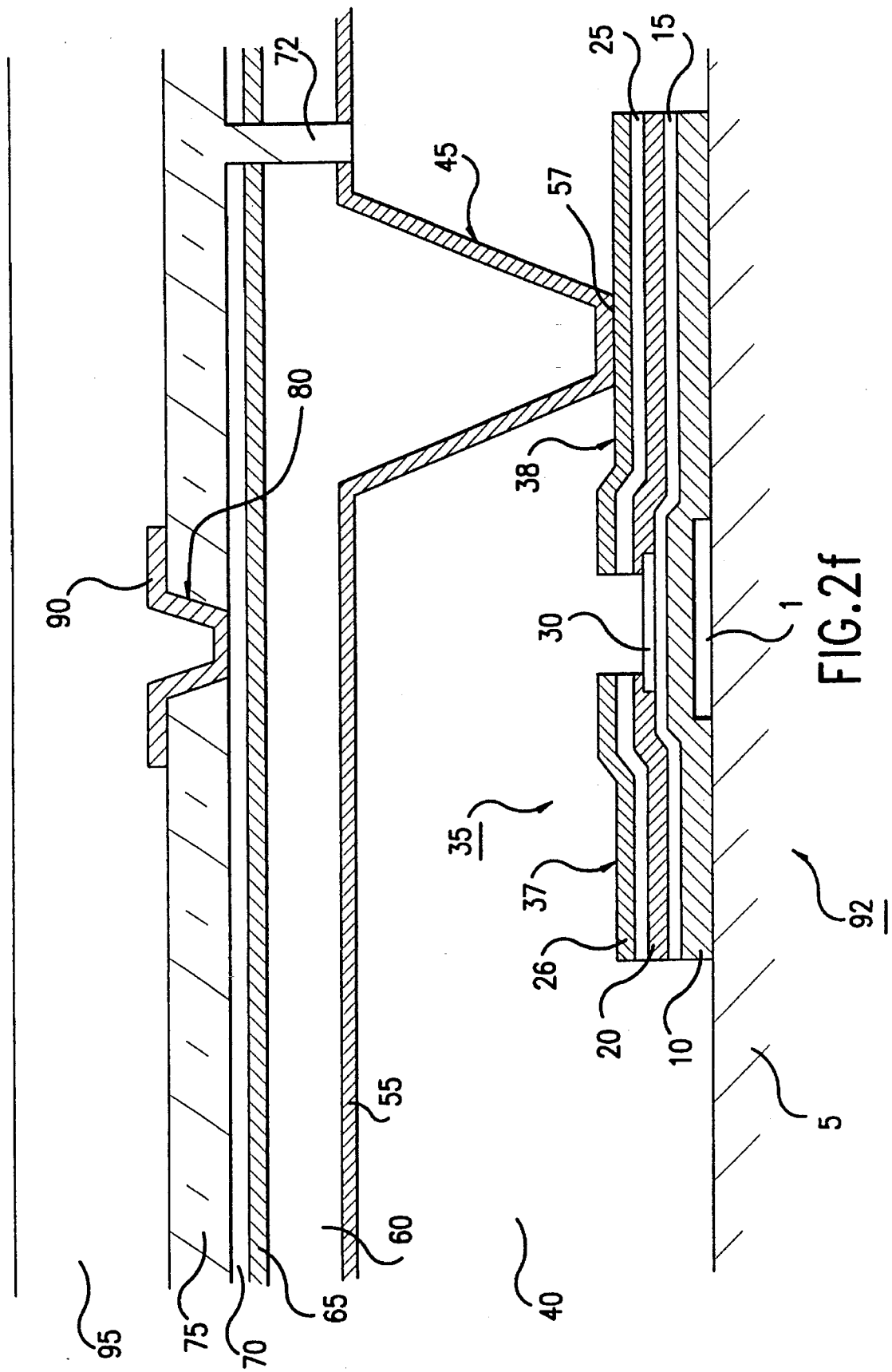

The SiON layer is masked and etched to form the via hole 80. In FIG. 2f, the metal bias layer 85 is formed over the SiON layer 75 so that the metal bias layer 85 contacts the conductive layer 70 through the via hole 80. The metal bias layer 85 is then masked and etched to form the bias contact 90. A passivation layer 95 is then formed over both the conductive layer 70 and the bias contact 90 to complete the photodetection device 92.

Figure 3:
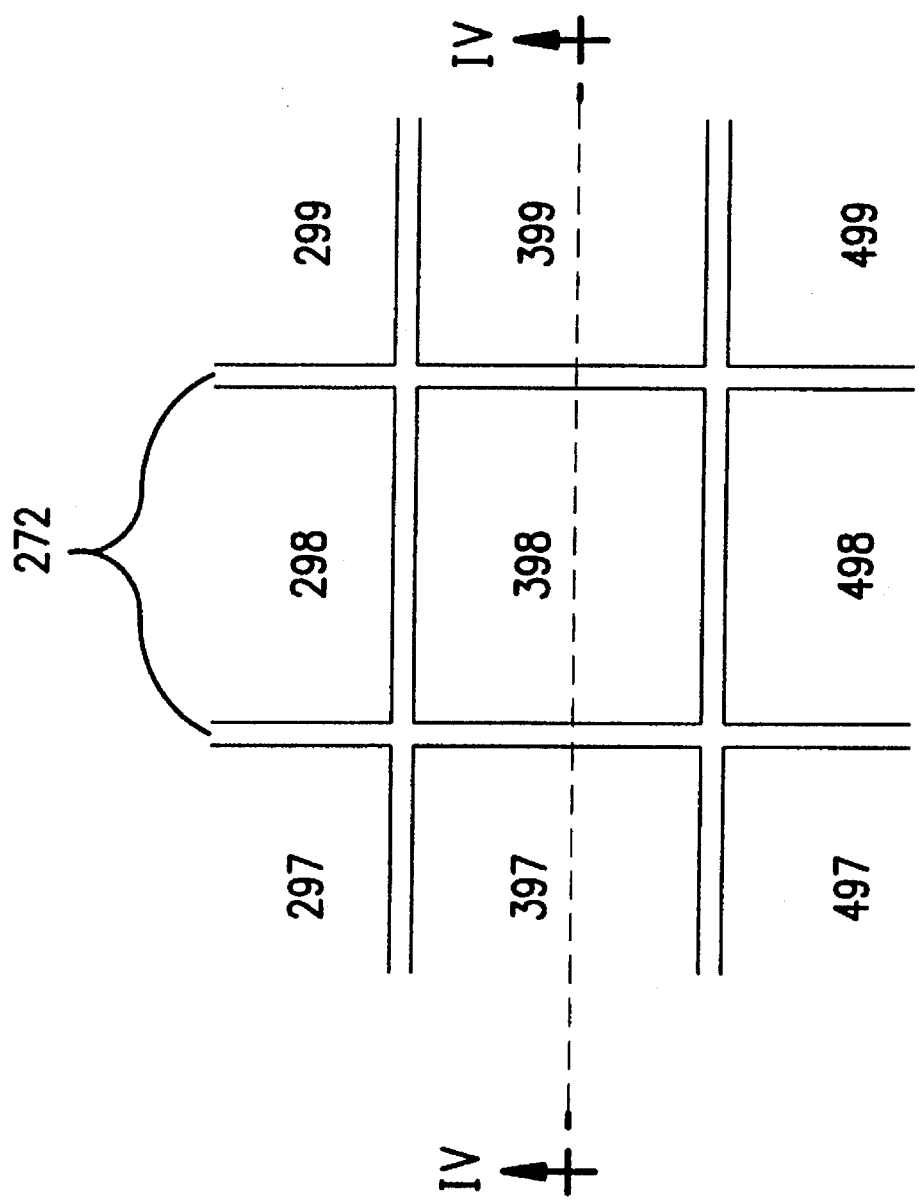
FIG. 3 is a top plan view of a contiguous two dimensional pixel array of the first preferred embodiment photodetection devices.
Figure 4:
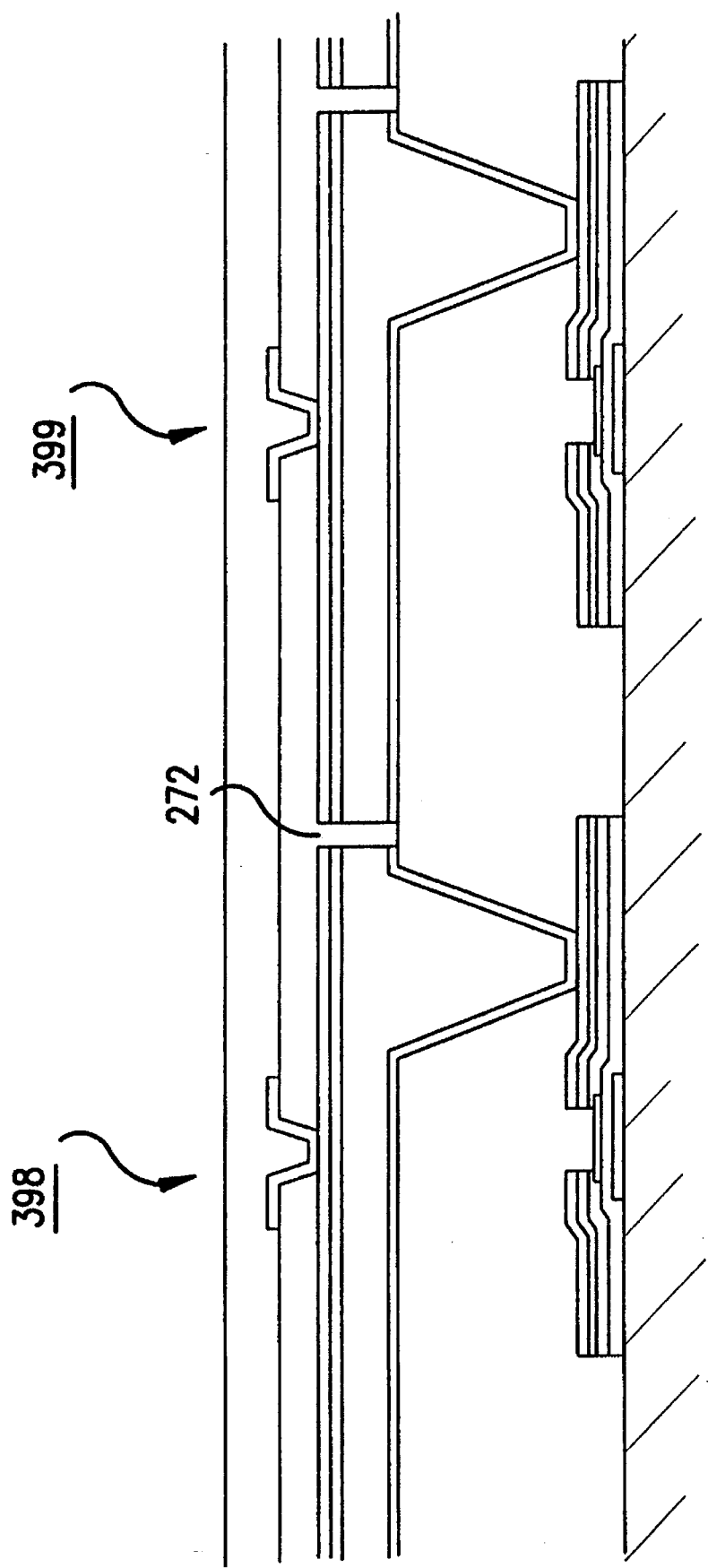
FIG. 4 is a cross-sectional view of two adjacent photodetection devices of FIG. 3.

FIG. 3 shows a matrix of adjacent photodiodes 297–299, 397–399 and 497–499. Each photodiode is separated from adjacent photodiodes by notches 272. Thus, the electric charge generated in the photodiode 398 is prevented from dispersing to any of the neighboring photodiodes 297–299, 397, 399 and 497–499. FIG. 4 shows a cross-section of the photodiodes 398–399 along cross-sectional line IIb—IIb.

The notch 272 segments the n+ doped layer 55, the a-Si:H layer 60, the p+ doped layer 65 and the conductive layer 70. Thus, the notch 272 isolates the photodiode 298 from adjacent photodiodes 297 and 299. This allows the photodiode 298 to independently accumulate charges and prevents the photocharge in the photodiode 298 from spreading across to the photodiodes 297 and 299. Accordingly, blurring of the image is prevented and the image resolution is preserved.

Of course it as appreciated that the notch 272 may be formed in any two dimensional polygonal pattern such as triangular or hexagonal patterns.

Figure 5:
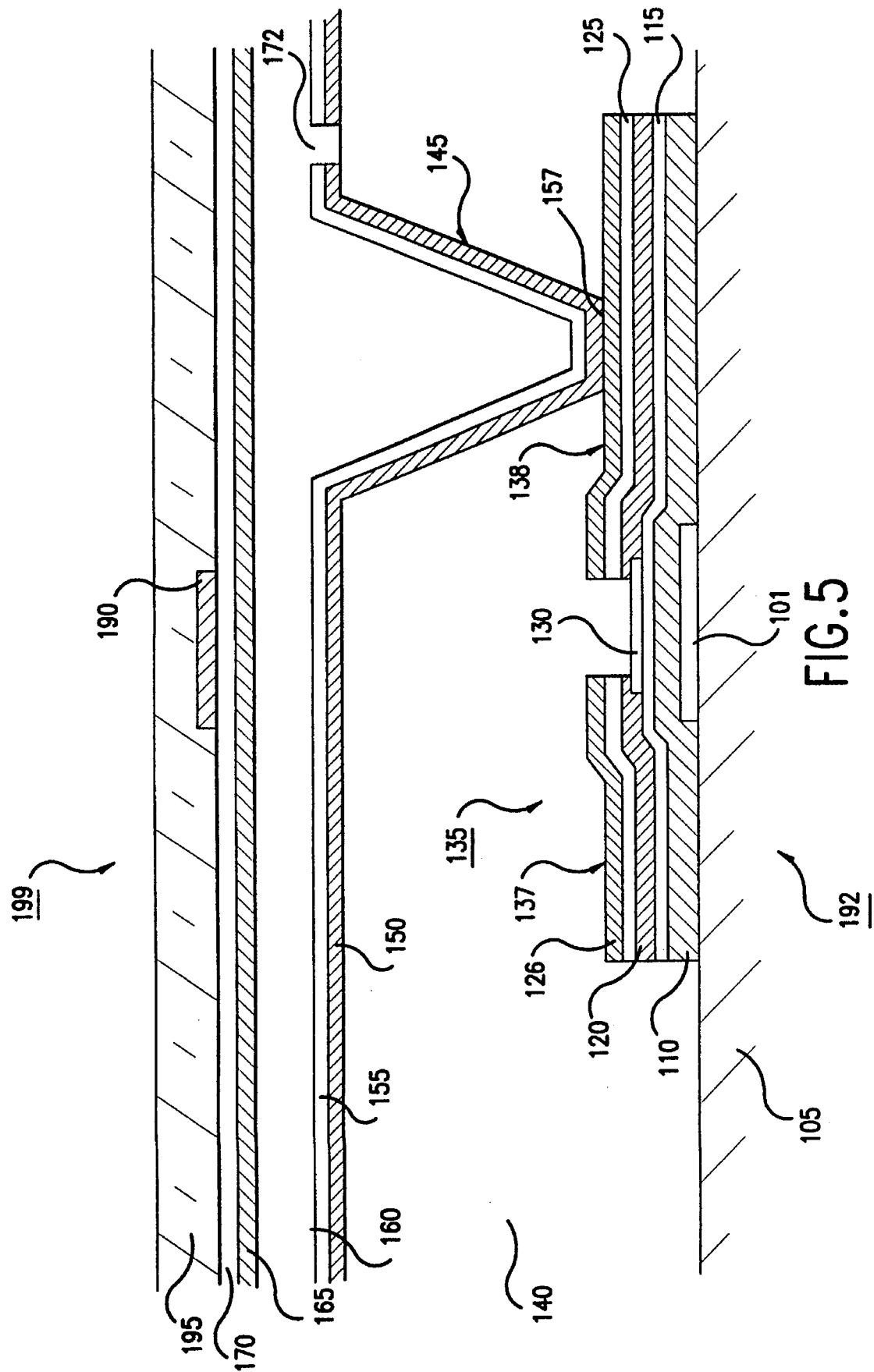
FIG. 5 is a cross-sectional view of a second preferred embodiment of the photodetection device.

FIG. 5 shows a second preferred embodiment. In the second embodiment, a metal layer 150 which is about 500Å to about 1000Å thick is formed between the SiON layer 140 and the n+ doped layer 155. A notch 172 passes through the n+ doped layer 155 and the metal layer 150 as compared to the notch 72 of the first embodiment which passes through the n+ doped layer 55, the a-Si:H layer 60, the p+ doped layer 65 and the conductive layer 70. The bias contact 190 contacts the conductive layer 170 as compared to the first embodiment that formed a SiON layer 75 containing a via hole 80 and then formed the bias contact 90 by masking and etching the metal bias layer 85. In the second embodiment, the conductive layer 170 and the bias contact 190 are covered by a passivation layer 195.

The bias contact is optional in the second preferred embodiment and should be so noted. The bias contact is added if the speed or total photocurrent drawn by the array requires more conductivity than that offered by the transparent conductive layer 170. In many cases, the bias contact 190 would be eliminated, since the conductive layer 170 of ITO is continuous, forms a relatively low resistance bias connection, and is simpler to fabricate.

In addition, since the top surface of the array (the conductive layer 170) is basically one continuous sheet of ITO, in the second preferred embodiment the top passivation layer may also be optional. The underlying dielectric layer 140, as well as the photodiode sensor itself, may form a suitable passivation layer to the array. An additional advantage to leaving off the top passivation layer 195 is that bare ITO can be more easily optimized for spectral response. The metal layer 150 is optional, depending on the resistance of the n+ layer 155. When the resistance of the n+ layer 155 is high enough to undesirably limit the readout speed of photocharges from the photodiode 199 by limiting current flow, the metal layer 150 may be added to increase conductivity and therefore the maximum readout speed of photocharges from the photodiode 199. Note also that the metal layer 150 could be included in the first preferred embodiment.

Figure 6A:
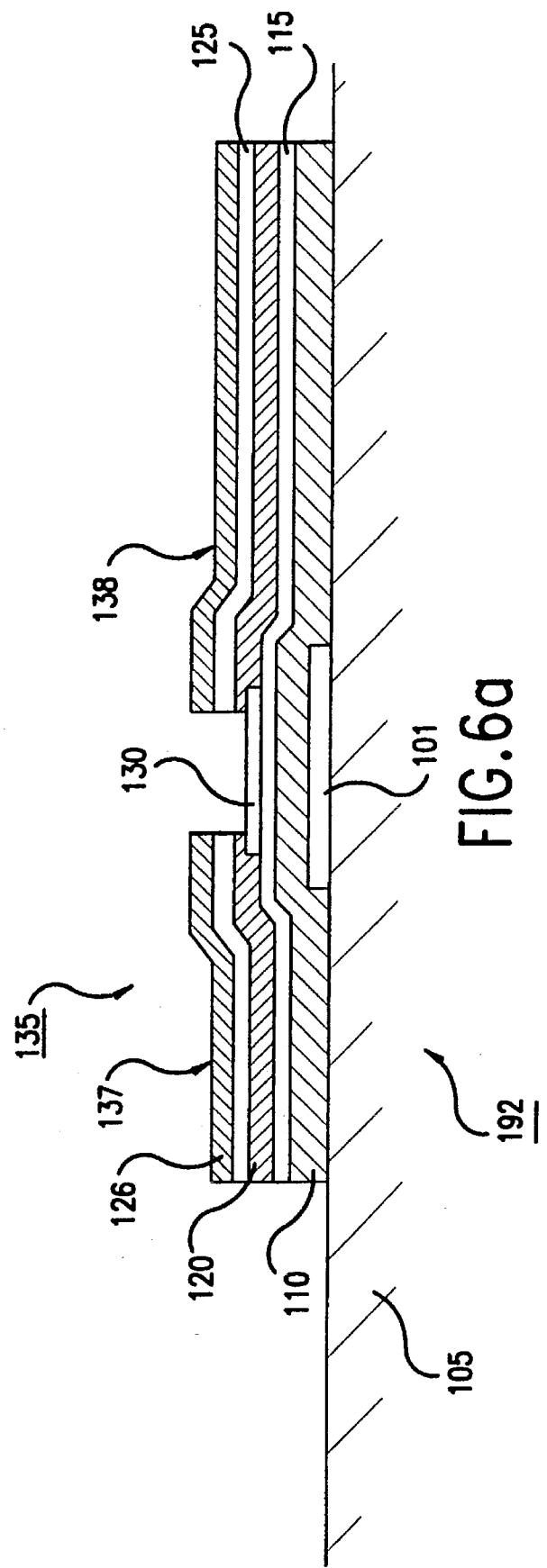
Figure 6B:
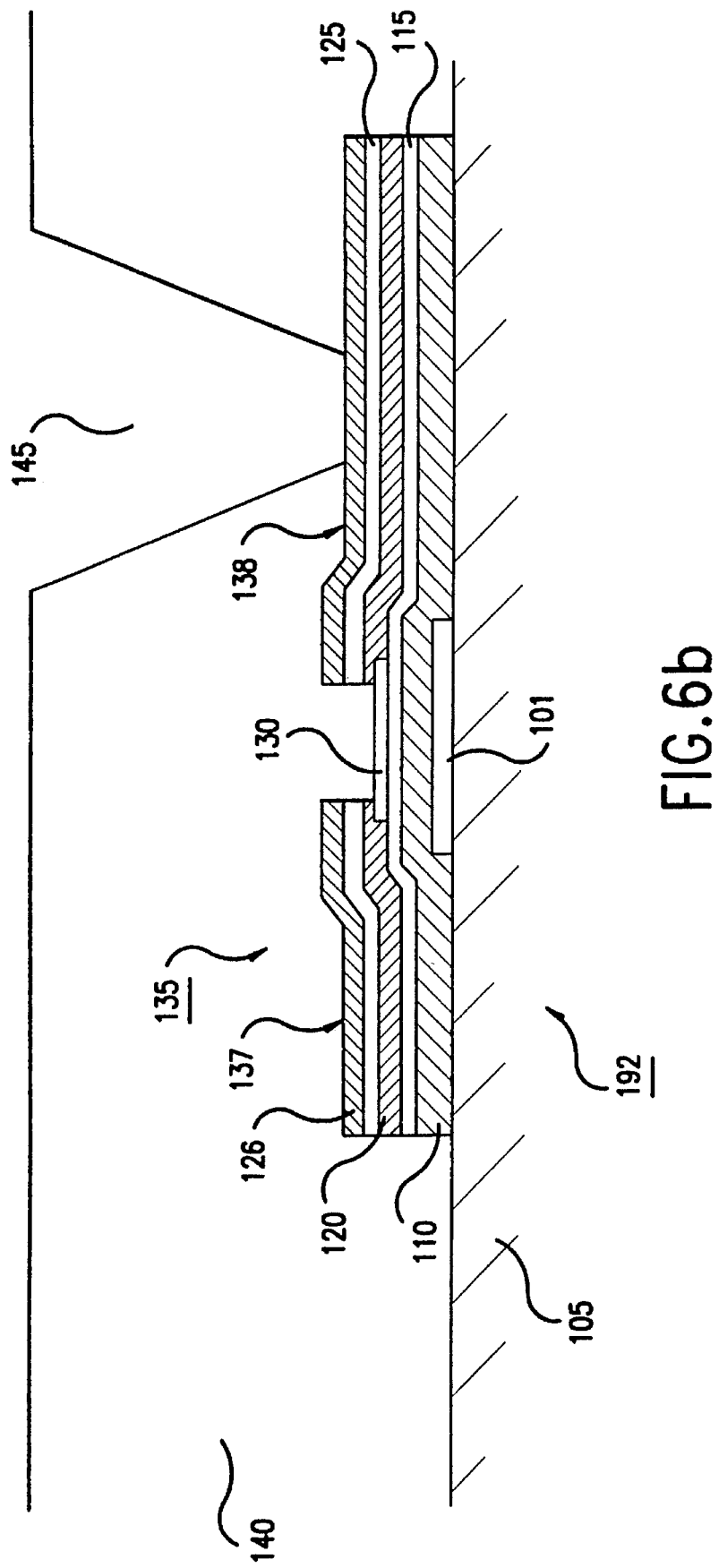
Figure 6C:
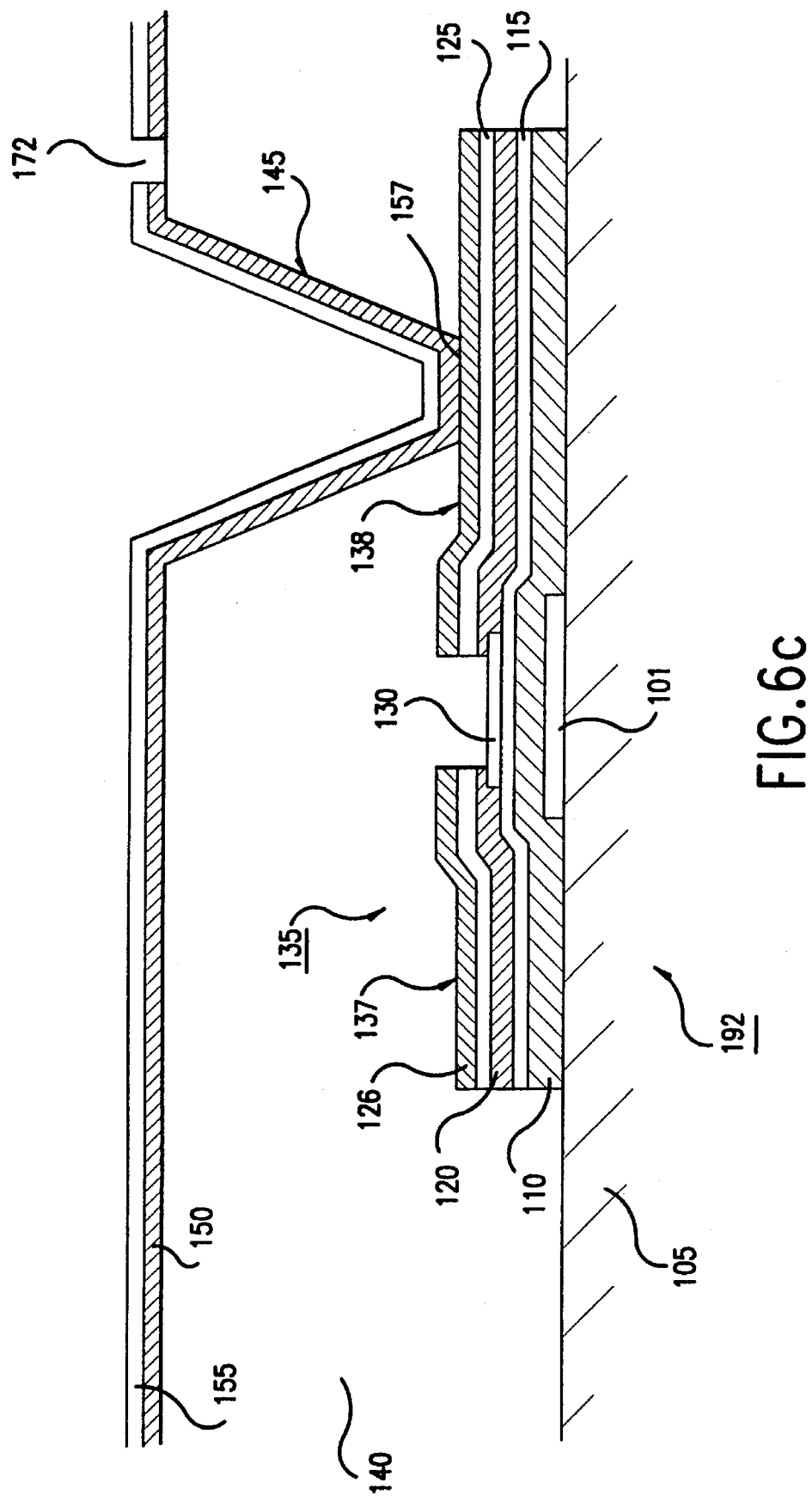

FIGS. 6a–6d show a process for forming the photodiode of the second embodiment. In FIG. 6a the TFT 135 is first formed over the substrate 105. The SiON layer 140 is formed over the TFT 135. In FIG. 6d, the SiON layer 140 is masked and etched to form a via hole 145 which exposes the drain electrode 138. In FIG. 6d, a metal layer 150 is formed over the SiON layer 140 and the via hole 145 to contact the drain electrode 138. The metal layer 150 is chromium (Cr) for this embodiment, although other suitably conductive metals such as TiW could alternately be used. The contact between the metal layer 150 and the drain electrode 138 is a back contact 157. An n+ doped layer 155 is formed over the metal layer 150. The n+ doped layer 155 is masked and etched to form a notch 172 through the n+ doped layer 155 and the metal layer 150.

In FIG. 6d, an undoped a-Si:H layer 160 is formed over the n+ doped layer 155 and the notch 172. A p+ doped layer 165 is formed over the a-Si:H layer 160. A conductive layer 170 is formed over the p+ doped layer 165. The conductive layer 170 for this embodiment is indium-tin-oxide (ITO).

A metal bias layer 185 is formed over the conductive layer 170. The metal bias layer 185 comprises TiW underneath aluminum for this embodiment. The TiW barrier metal could be replaced with other refractory metals such as Ti, Mo, or Cr. The metal bias layer 185 is masked and etched to form a bias contact 190. Finally, a passivation layer 195 is formed over both the bias contact 190 and the conductive layer 170 to complete the photodetection device 192. The passivation layer 195 comprises SiON for this embodiment.

Figure 8:
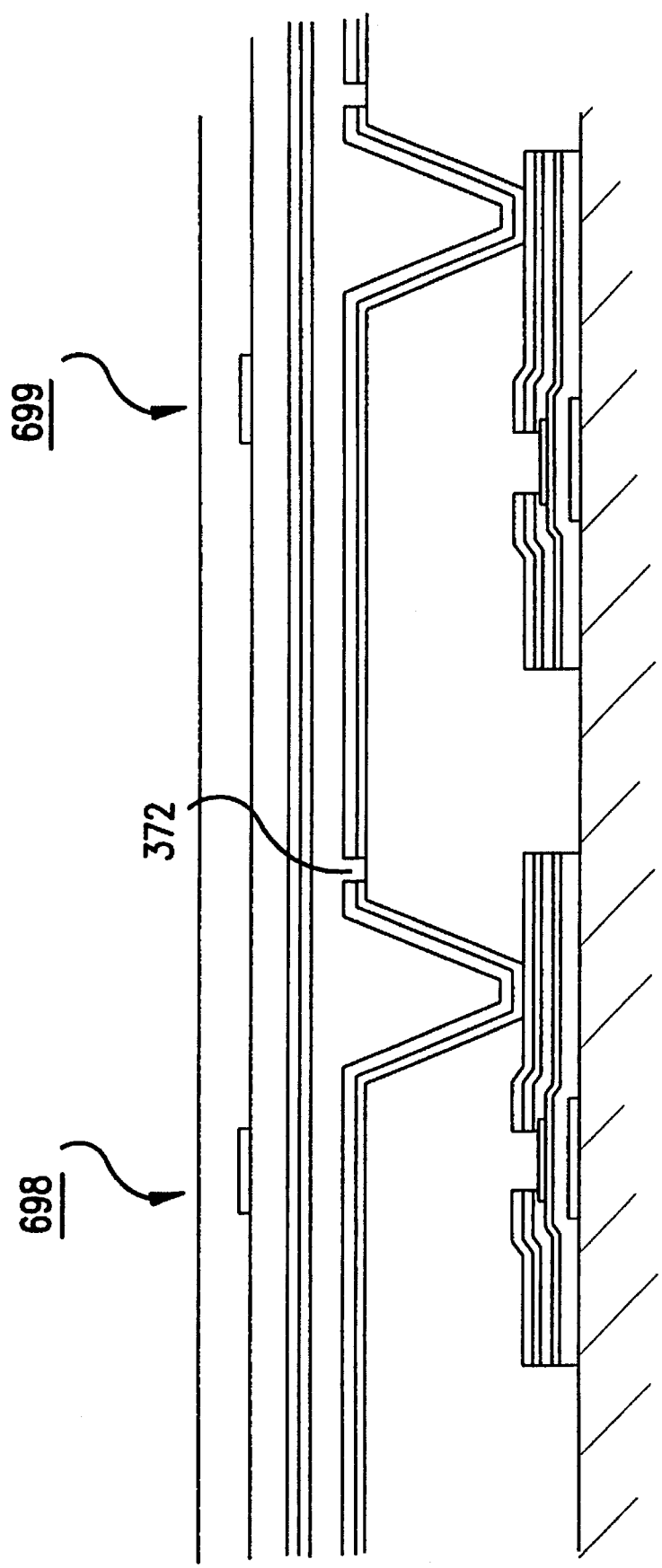
FIG. 8 is a cross-sectional view of two adjacent photodetection devices of FIG. 7.

Like the first embodiment, the photodetection device 192 of the second embodiment may be configured into a matrix as shown in FIG. 7. FIG. 8 shows a cross section from FIG. 7 of photodiodes 698–699 along cross section line VIII—VIII for the second embodiment. In FIG. 7 the notch 372 separates photodiode 698 from adjacent photodiodes 697, 699, 597–599, and 797–799.

The photodetection device 192 of the second embodiment functions similarly to the photodetection device 92 of the first embodiment. In FIG. 5, the photodiode 199 is biased by applying a voltage potential to the bias contact 190. This bias induces an electric field in the photodiode 199. When the TFT 135 is OFF, the photodiode 199 generates election-hole pairs as light enters the a-SiH layer 160. The generated charges are accumulated by the n+ doped layer 155. When the TFT 135 is turned ON by applying a voltage to the gate electrode 101, the accumulated charge is transferred to other components through the TFT 135.

The notch 172 through the n+ layer 155 and the metal layer 150 prevents electric charge generated in the photodiode 199 from spreading through the n+ layer 155 and the metal layer 150 to adjacent photodiodes. The low mobility of electrons and holes in a-Si:H limits the lateral diffusion of photogenerated carriers. This lateral diffusion is less than 5 μm in a-Si:H. Thus, despite the continuous nature of the undoped a-Si:H layer 160, the resolution of the photodetection device 192 is preserved.

The notch 172 is formed only in the n+ doped layer 155 and the metal layer 150 rather than the n+ doped layer 155, the undoped a-Si:H layer 160, the p+ doped layer 165 and the conductive layer 170 as in the first embodiment. The notch 172 is formed using fewer steps than the notch 72 of the first embodiment. In addition, because the notch 172 does not pass through the conductive layer 170, the SiON layer 75 having a via hole 80 of the first embodiment is omitted from the second embodiment. Therefore manufacturing process is simplified and manufacturing cost is reduced.

For both the first and second embodiments, the photodiodes 99 and 199 are formed over the TFTs 35 and 135. Since the TFTs 35 and 135 may be also be used for other devices such as active matrix liquid crystal displays, the cost of manufacturing the TFTs 35 and 135 may be shared across many products thus reducing overall manufacturing costs. The process flow for making display plates and imaging plates is now much more similar under these embodiments, which simplifies manufacturing equipment and lowers manufacturing costs.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A photodetecting device, comprising:
   a substrate;
   at least one transistor formed over the substrate; and
   at least one photodiode formed over the at least one transistor, wherein each of the at least one photodiode is coupled to one of the at least one transistor, and the coupling comprises an electrical connection between the photodiode and a drain electrode of the transistor.

2. The device of claim 1, wherein a first passivation layer is formed between the at least one transistor and the at least one photodiode, each of the at least one photodiode comprising:
   an n+ layer formed over the first passivation layer;
   an amorphous silicon layer formed over the n+ layer;
   a p+ layer formed over the amorphous silicon layer; and
   a conductive layer formed over the p+ layer.

3. The device of claim 2, wherein:
   the n+ layer is about 500 angstroms to about 1000 angstroms thick;
   the amorphous silicon layer is about 0.5 microns to about 2.0 microns thick;
   the p+ layer is about 100 angstroms thick; and
   the conductive layer is about 500 angstroms to about 1000 angstroms thick.

4. The device of claim 2, each of the at least one photodiode further comprising a bias contact formed over the conductive layer, wherein the bias contact shields one of the at least one transistor from light.

5. The device of claim 2, wherein the at least one photodiode is arranged in a matrix having at least one row and at least one column, each of the at least one photodiode being separated from adjacent photodiodes by a notch.

6. The device of claim 5, wherein the notch is about 3 microns to about 10 microns wide.

7. The device of claim 5, wherein the notch is formed in the n+ layer.

8. The device of claim 5, wherein a metal layer is formed between the n+ layer and the first passivation layer, the notch being formed in the metal layer and the n+ layer.

9. The device of claim 5, wherein the notch is formed in the conductive layer, the p+ layer, the amorphous silicon layer and the n+ layer.

10. The device of claim 5, wherein a metal layer is formed between the n+ layer and the first passivation layer, the notch being formed in the conductive layer, the p+ layer, the amorphous silicon layer, the n+ layer, and the metal layer.

11. The device of claim 2, further comprising:

at least one via hole formed in the first passivation layer, each of the at least one via hole exposing a drain electrode of one of the at least one transistor, the n+ layer contacting the drain electrode of the at least one transistor through each of the at least one via hole forming at least one back contact.

12. The device of claim 11, wherein each of the at least one back contact is about 10 microns wide.

13. The device of claim 2, further comprising:

at least one via hole formed in the first passivation layer, each of the at least one via hole exposing a drain electrode of one of the at least one transistor; and a metal layer formed between the n+ layer and the first passivation layer, the metal layer contacting the drain electrode of the at least one transistor through each of the at least one via hole forming at least one back contact.

14. The device of claim 13, wherein the at least one back contact is about 10 microns wide.

15. A method for manufacturing a photodetecting device, comprising:

forming at least one transistor over a substrate; and forming at least one photodiode over the at least one transistor, each of the at least one photodiode being coupled to one of the at least one transistor, the coupling comprising an electrical connection between the photodiode and a drain electrode of the transistor.

16. The method of claim 15, further comprising:

forming a first passivation layer over the at least one transistor formed over the substrate;

forming an n+ layer over the passivation layer;

forming an amorphous silicon layer over the n+ layer;

forming a p+ layer over the amorphous silicon layer; and forming a conductive layer over the p+ layer.

17. The method of claim 16, wherein the at least one photodiode is arranged in a matrix having at least one row and at least one column, each of the at least one photodiode being separated from adjacent photodiodes by a notch.

18. The method of claim 17, wherein the notch is formed by;

masking the n+ layer; and etching the n+ layer.

19. The method of claim 17, further comprising forming a metal layer between the n+ layer and the first passivation layer, wherein the notch is formed by;

masking the n+ layer; and etching through the n+ layer and the metal layer.

20. The method of claim 16, further comprising:

masking the first passivation layer;

etching the first passivation layer to form at least one via hole exposing a drain electrode of each of the at least one transistor; and forming the n+ layer over the first passivation layer, the n+ layer contacting the drain electrode of each of the at least one transistor through the at least one via hole forming at least one back contact.

21. The method of claim 16, further comprising:

masking the first passivation layer;

etching the first passivation layer to form at least one via hole exposing a drain electrode of each one of the at least one transistor; and forming a metal layer between the first passivation layer and the n+ layer, the metal layer contacting the drain electrode of each of the at least one transistor through the at least one via hole forming at least one back contact.

* * * * *